(12) United States Patent
Chan et al.

(10) Patent No.: US 6,730,571 B1
(45) Date of Patent: May 4, 2004

(54) METHOD TO FORM A CROSS NETWORK OF AIR GAPS WITHIN IMD LAYER

(75) Inventors: Lap Chan, San Francisco, CA (US); Cher Liang Cha, Singapore (SG); Kheng Chok Tee, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/418,029

(22) Filed: Oct. 14, 1999

(51) Int. Cl.[7] .................. H01L 21/331; H01L 21/76; H01L 21/4763
(52) U.S. Cl. .................. 438/319; 438/411; 438/421; 438/422; 438/619; 257/522
(58) Field of Search ................. 438/619, 421, 438/422, 319, 411; 257/522

(56) References Cited

U.S. PATENT DOCUMENTS

| | | | |
|---|---|---|---|
| 5,141,896 A | * 8/1992 | Katoh | 437/195 |
| 5,308,440 A | * 5/1994 | Chino et al. | 156/664 |
| 5,461,003 A | * 10/1995 | Havemann et al. | 437/187 |
| 5,527,737 A | 6/1996 | Jeng | 437/195 |
| 5,561,085 A | 10/1996 | Gorowitz et al. | 437/209 |
| 5,783,864 A | 7/1998 | Dawson et al. | 257/758 |
| 5,828,121 A | 10/1998 | Lur et al. | 257/522 |
| 5,908,318 A | 6/1999 | Wang et al. | 438/619 |
| 6,060,383 A | * 5/2000 | Nogami et al. | 438/622 |
| 6,097,092 A | * 8/2000 | Natzle | 257/758 |
| 6,211,561 B1 | * 4/2001 | Zhao | 257/522 |
| 6,281,587 B1 | * 8/2001 | Nogami et al. | 257/758 |
| 6,294,455 B1 | * 9/2001 | Ahn | 438/619 |
| 6,297,145 B1 | * 10/2001 | Ito | 438/619 |

* cited by examiner

*Primary Examiner*—Long Pham
*Assistant Examiner*—Shrinivas Rao
(74) *Attorney, Agent, or Firm*—George O. Saile; Rosemary L. S. Pike

(57) ABSTRACT

In accordance with the objectives of the invention a new method is provided for creating air gaps in a layer of IMD. First and second layers of dielectric are successively deposited over a surface; the surface contains metal lines running in an Y-direction. Trenches are etched in the first and second layer of dielectric in an X and Y-direction respectively. The trenches are filled with a layer of nitride and polished. A thin layer of oxide is deposited over the surface of the second layer of dielectric. Openings are created through the thin layer of oxide that align with the points of intersect of the nitride in the trenches in the layers of dielectric. The nitride is removed from the trenches by a wet etch, thereby opening trenches in the layers of dielectric with both sets of trenches being interconnected. The openings in the thin layer of oxide are closed, leaving a network of trenches containing air in the two layers of dielectric.

23 Claims, 7 Drawing Sheets

METHOD TO FORM A CROSS NETWORK OF AIR GAPS WITHIN IMD LAYER

BACKGROUND OF THE INVENTION (1) Field of the Invention

The invention relates to the fabrication of integrated circuit devices and more particularly, to a method of creating a network of air gaps that is located in a layer of Inter Metal Dielectric of a semiconductor device.

(2) Description of the Prior Art

The increased device density that is part of semiconductor device fabrication leads to the placing of numerous devices on one monolithic substrate. The individual devices are electrically isolated from each other and are interconnected to other semiconductor devices of the total package to perform certain desired circuit functions. Decreased device dimensions result in a reduction of electrical energy that can be stored in a device. This reduction of device size further results in a reduction of the internal device capacitances such as parasitic capacitances at source and drain regions of a gate electrode of MOS devices. At these reduced devices capacitances, the relative parasitic capacitance of the device interconnect lines become more important in the design of the semiconductor device and in the ability of the device to perform the required functions at the required frequency and the required power level. The interconnect capacitance becomes an important fraction of the capacitance of each circuit, an effect that is especially pronounced as the operating frequency of the device is increased. With more device function packed in smaller device geometry, more signal lines are in closer physical proximity than ever before resulting in an increased impact of parasitic capacitances of the signal lines. This problem of interconnect parasitic capacitance must therefore be addressed whereby processes or solutions that result in reducing this capacitance are the objective.

Coupling capacitances between adjacent lines are dependent on a number of factors such as the length of the lines, the proximity of the lines and the distance over which the lines runs adjacent to lines in close proximity. Longer lines result in increased capacitive coupling, as does closer proximity between lines. Of equal importance in determining the capacitive coupling that occurs between adjacent lines is the material that is used to separate adjacent lines. Materials (that are used between adjacent lines) that have a high dielectric constant increase the capacitive coupling between the adjacent lines while materials with low dielectric constant decrease the capacitive coupling between adjacent lines. It is therefore important to select materials (dielectrics) that are used to separate interconnect lines that have as low a dielectric constant as possible. Conventional semiconductor fabrication typically uses silicon dioxide as a dielectric; this has a dielectric constant of about 3.9. Other examples are silicon with a dielectric constant of 11.7, silicon nitride with a dielectric constant of 7.0, Spin-On-Glass with a dielectric constant of 4.0. All of these examples are of dielectric materials that have a dielectric constant that is too high for application with sub-micron device feature sizes and that would impose serious limitations on device performance both in the frequency range in which the device can be used and in the power or switching level of the device. For high frequency operation, power consumption increases proportionally with frequency. For a given interconnect layout, both power consumption and crosstalk decrease, and performance increases, as the dielectric constant of the insulator decreases.

The use of many of the low dielectric constant materials, such as aerogel with a dielectric constant of 1.2, is not feasible due to the fact that equipment is not available to properly process the new dielectric material in various integrated circuits or because these materials require critical steps of processing which significantly increase the manufacturing cost. Also, the chemical or physical properties of many low dielectric constant materials are usually difficult to make compatible with or integrate into conventional integrated circuit processing. For instance, aerogel requires a very sensitive drying step that is not well suited for a high volume, low cost process of semiconductor device manufacturing.

The lowest possible and therefore the ideal dielectric constant is 1.0, this is the dielectric constant of a vacuum whereas air has a dielectric constant of slightly larger than 1.0.

The formation of air gaps between conducting lines of high speed Integrated Circuits (IC's) is typically a combination of the deposition of a metal layer, selective etching of the metal layer to form the desired line patterns, the deposition of a porous dielectric layer or a disposable liquid layer which is then selectively removed to form the desired air-gaps.

The presence of a high level of capacitive coupling between adjacent signal lines can result in an increase of capacitive crosstalk between adjacent conductor lines of a semiconductor circuit, that is the voltage on a first conductor line alters or affects the voltage on a second conductor line. This alteration in voltage can cause erroneous voltage levels in the Integrated Circuit making the IC increasingly prone to faulty operation. It becomes therefore imperative to reduce the resistance capacitance (RC) time constant and the crosstalk between adjacent conducting lines.

The invention addresses the creation of air gaps that are created in a layer of Inter Metal Dielectric (IMD). For Prior Art applications of a layer of IMD, the layer of IMD has to be thick in order to significantly reduce crosstalk and the RC delay of the adjacent metal lines. However, this thickness by its very nature limits the aspect ratio of the contact openings that can be established in the layer of IMD, which is contrary to the requirement of sub-micron device features. In addition, dielectric materials that have the required low-k value do not have the mechanical strength to support overlying device features if high aspect ratio openings are created in the dielectric. It is therefore required to provide a method that reduces the capacitive coupling through the layer of IMD while at the same time providing a mechanically stable support structure within the semiconductor device.

U.S. Pat. No. 5,828,121 (Lur et al.) shows an air gap between metal lines at different levels by etching the dielectric layers between the metal line levels. This is close to the invention.

U.S. Pat. No. 5,783,864 (Dawson et al.) shows air gaps and pillars between metal layers. This is close to the invention.

U.S. Pat. No. 5,561,085 (Gorowitz et al.) shows a method for forming air gap bridges.

U.S. Pat. No. 5,461,003 (Havemann et al.) and U.S. Pat. No. 5,527,137 (Jeng) show other air gap processes.

U.S. Pat. No. 5,908,318 (Wang et al.) shows an air gap in an ILD by etch out.

SUMMARY OF THE INVENTION

A principle objective of the invention is to provide a method to form air gaps between metal lines thereby reducing capacitive coupling through a layer of Inter Metal Dielectric.

Another objective of the invention is to provide a structure of air gap formation in a layer of IMD that is mechanically stable.

In accordance with the objectives of the invention a new method is provided for creating air gaps in a layer of IMD. First and second layers of dielectric are successively deposited over a surface; the surface contains metal lines running in an Y-direction. Trenches are etched in the first and second layer of dielectric in an X and Y-direction respectively. The trenches are filled with a layer of nitride and polished. A thin layer of oxide is deposited over the surface of the second layer of dielectric. Openings are created through the thin layer of oxide that align with the points of intersect of the nitride in the trenches in the layers of dielectric. The nitride is removed from the trenches by a wet etch, thereby opening trenches in the layers of dielectric with both sets of trenches being interconnected. The openings in the thin layer of oxide are closed, leaving a network of trenches containing air in the two layers of dielectric.

DESCRIPTION OF THE PREFERRED EMBODIMENTS

Figure 1A:
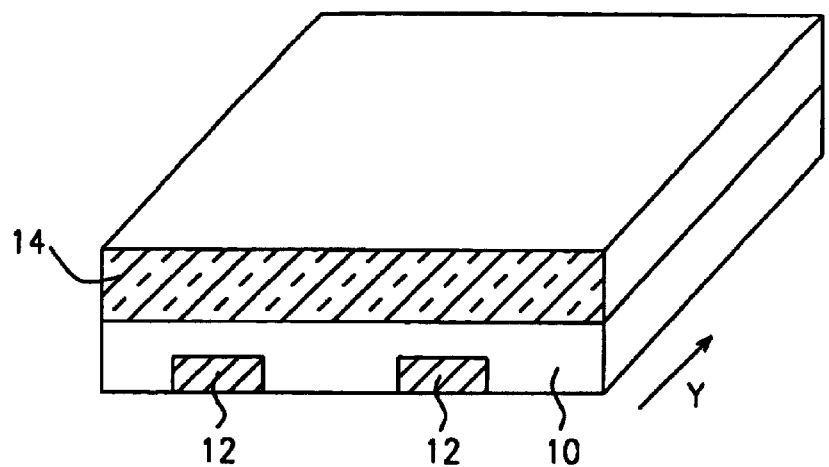
FIG. 1a shows an expanded view of a surface over which a first layer of dielectric has been deposited.

Referring now specifically to FIG. 1a, there is shown an expanded three-dimensional view of a surface 10 over which a first layer 14 of dielectric has been deposited. Metal contacts 12 have been provided in the layer 10. Layer 10 can typically be the surface of a dielectric layer. The surface 10 is however not limited to the surface of a substrate but can be any surface that is used in the creation of a semiconductor device.

Layer 14 of Inter Metal Dielectric can contain any suitable dielectric such as for instance silicon dioxide ("oxide", doped or undoped) or silicon nitride ("nitride"), silicon oxynitride, fluoropolymer, parylene, polyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), a low dielectric constant material, such as hydrogen silsesquioxane and HDP-FSG (high-density-plasma fluorine-doped silicate glass).

The most commonly used and therefore the preferred dielectrics are silicon dioxide (doped or undoped), silicon oxynitride, parylene or polyimide, spin-on-glass, plasma oxide or LPCVD oxide. The preferred dielectric material to be used for the invention is $SiO_2$.

The deposition of the layer 14 of dielectric uses conventional deposition technology and can, for instance, be deposited using PECVD procedures at a temperature of between about 350 and 450 degrees C. to a thickness between about 5000 and 10,000 Angstrom using TEOS as a source.

Figure 1B:
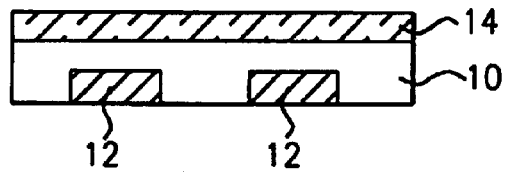
FIG. 1b shows a corresponding cross section taken in the X-direction.

FIG. 1b shows a cross section of surface 10, the metal contact points 12 in layer 10 and the layer 14 of dielectric that has been deposited over the surface 10. The cross section that is shown in FIG. 1b is a cross section in the X-direction of the surface 10.

Figure 2A:
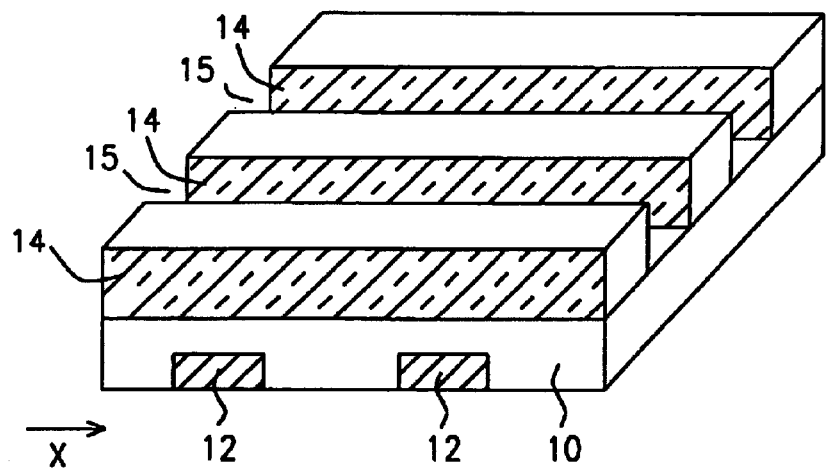
FIG. 2a shows an expanded view of a surface after trenches have been etched in the X-direction in the first layer of dielectric.

FIG. 2a shows an expanded view of the surface 10 after the first layer of oxide has been masked and etched to form trenches 15 in the first layer 14 of IMD. These trenches run in the X-direction of the surface 10. Standard photolithography and RIE procedures, using $CF_4/CHF_3$ as etchant gas, are used to create the trenches in the first layer 14 of dielectric.

Figure 2B:
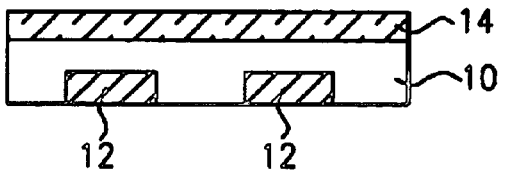
FIG. 2b shows a corresponding cross section taken in the X-direction.

FIG. 2b shows a cross section of surface 10, the metal contact points 12 in layer 10 and the layer 14 of dielectric that has been deposited over the surface 10. The cross section that is shown in FIG. 2b is a cross section in the X-direction of the surface 10 and does therefore not show the trenches 15 that have been created in the first layer of dielectric 14.

Figure 3A:
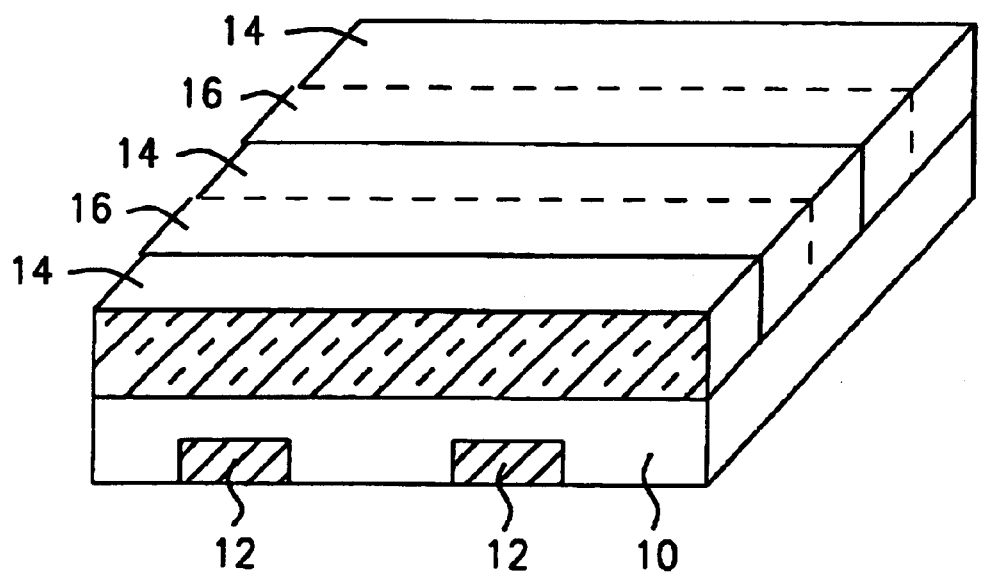
FIG. 3a shows an expanded view of a surface after the trenches in the first layer of dielectric have been filled with nitride.

FIG. 3a shows an expanded view of the surface 10 after the trenches in the first layer 14 of dielectric have been filled with nitride (16). The layer 16 of nitride can be deposited using PECVD procedures at a pressure between about 200 mTorr and 2000 mTorr, at a temperature between about 350 and 450 degrees C., using $NH_3$ and $SiH_4$ as source, to a thickness that is adequate to fill the trenches in the first layer of dielectric and to slightly overlay the exposed surface of the first layer of dielectric. The deposited nitride is polished using standard CMP to at least the surface of the first layer 14 of dielectric.

Figure 3B:
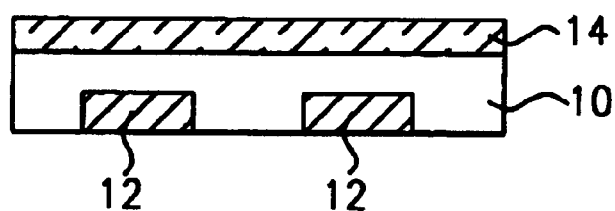
FIG. 3b shows a corresponding cross section taken in the X-direction.

FIG. 3b shows a cross section of surface 10, the metal contact points 12 in layer 10 and the layer 14 of dielectric that has been deposited over the surface 10. The cross section that is shown in FIG. 3b is a cross section in the X-direction of the surface 10 and does therefore not show the nitride that has been deposited in the trenches in the first layer of dielectric 14.

Figure 4A:
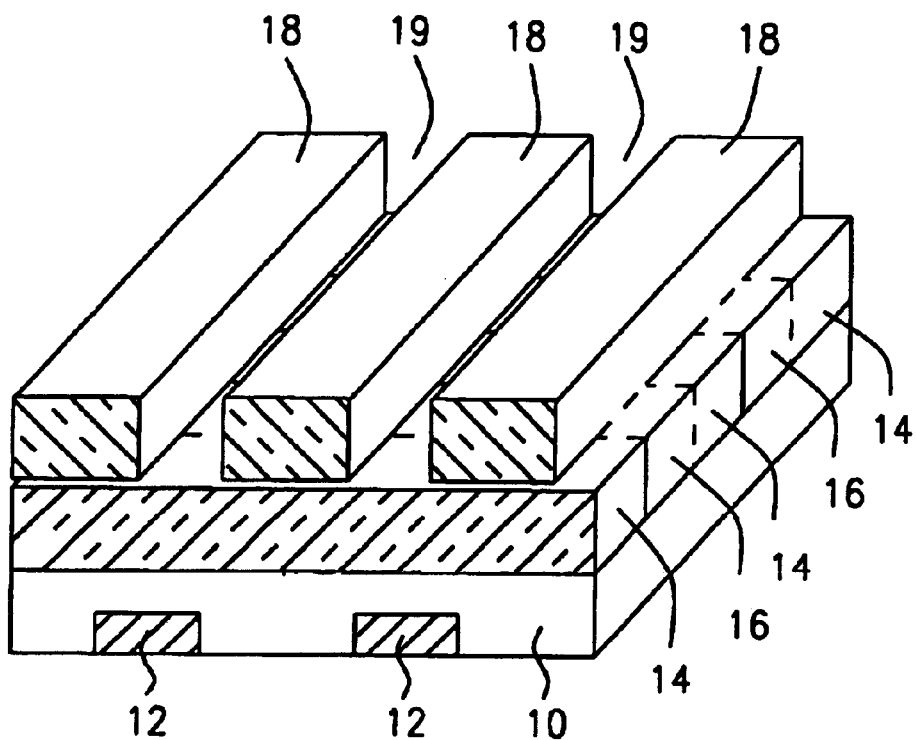
FIG. 4a shows an expanded view of a surface after a second layer of dielectric has been deposited and after trenches have been etched in the Y-direction in the second layer of dielectric.

FIG. 4a shows an expanded view of the surface 10 after a second layer 18 of dielectric has been deposited and after trenches 19 have been etched in the Y-direction in the second layer 18 of dielectric. The methods and processing conditions for this step can be the same as previously have been highlighted for the first layer 14 of dielectric under FIG. 2a and do therefore not need to be further highlighted at this point.

Figure 4B:
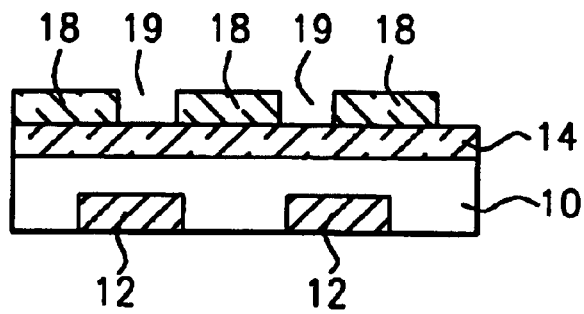
FIG. 4b shows a corresponding cross section taken in the X-direction.

FIG. 4b shows a cross section of surface 10, the metal contact points 12 in layer 10 and the layer 14 of dielectric that has been deposited over the surface 10. The cross section that is shown in FIG. 4b is a cross section in the X-direction of the surface 10 and shows the second layer 18 of dielectric that has been deposited over the first layer of dielectric 14 and the trenches 19 that have been created in the second layer of dielectric 18.

Figure 5A:
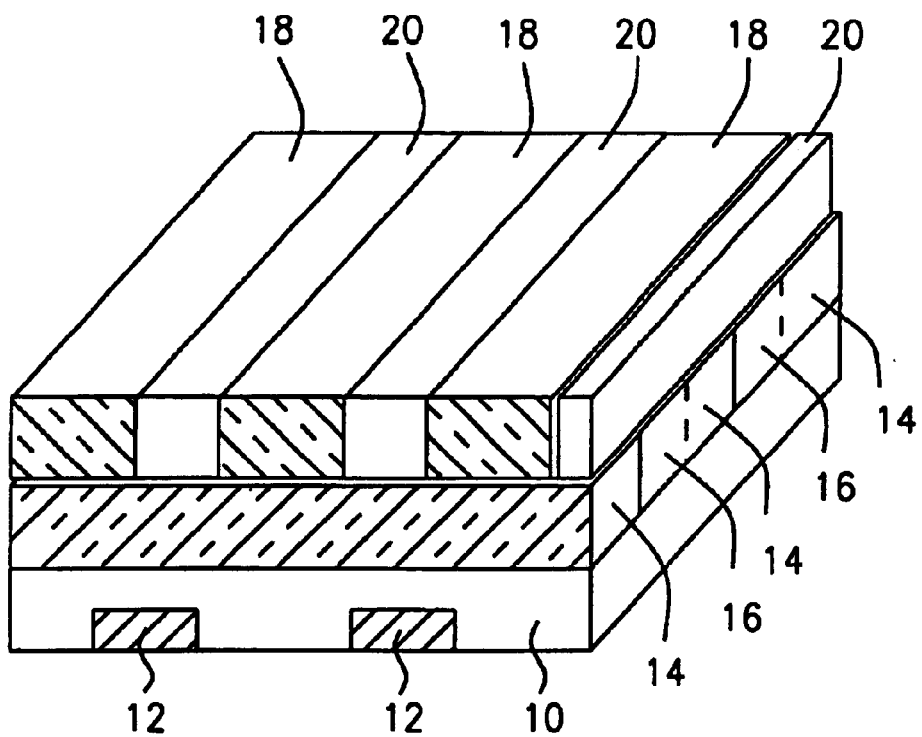
FIG. 5a shows an expanded view of a surface after the trenches in the second layer of dielectric have been filled with nitride.

FIG. 5a shows an expanded view of the surface 10 after the trenches in the second layer 18 of dielectric have been filled with nitride (20). The methods and processing conditions for this step can be the same as previously have been highlighted for the nitride deposition under FIG. 3a and do therefore not need to be further highlighted at this point.

Figure 5B:
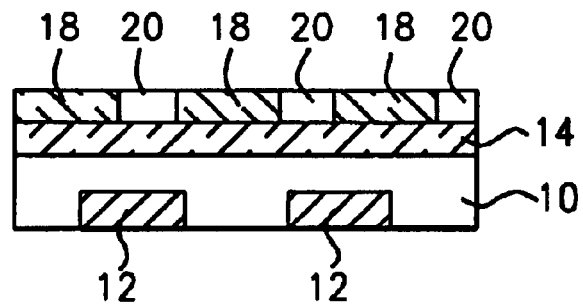
FIG. 5b shows a corresponding cross section taken in the X-direction.

FIG. 5b shows a cross section of surface 10, the metal contact points 12 in layer 10 and the layer 14 of dielectric that has been deposited over the surface 10. The cross section that is shown in FIG. 4b is a cross section in the X-direction of the surface 10 and shows the second layer 18 of dielectric that has been deposited over the first layer of dielectric 14 and the nitride 20 in the trenches (19, FIGS. 4a and 4b) that have been created in the second layer of dielectric 18.

Figure 6A:
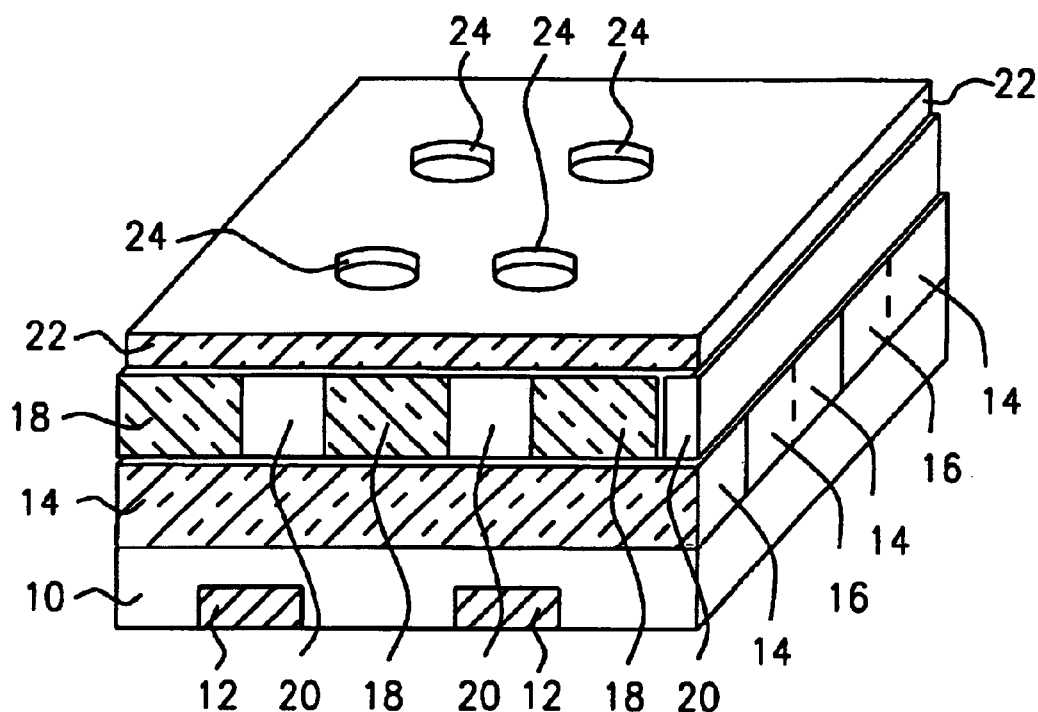
FIG. 6a shows an expanded view of a surface after a first thin layer of oxide has been deposited over the surface of the second layer of dielectric and after openings have been etched in this first thin layer of oxide.

FIG. 6a shows an expanded view of the surface 10 after a first thin layer 22 of oxide has been deposited over the surface of the second layer 18 of dielectric thereby including the nitride (20) that has been deposited in the trenches of the second layer of dielectric. Openings 24 have been etched in this thin layer 22 of oxide. The nitride that has been used to fill the trenches (15, FIG. 2a) that have been created in the first layer 14 of dielectric intersect is in contact with the nitride that has been used to fill the trenches (19, FIGS. 4a and 4b) that have been created in the second layer 18 of dielectric. The angle of intersection of the trenches in the first (etched in the X-direction of the surface 10) and second (etched in the Y-direction of the surface 10) layer of dielectric is 90 degrees. Openings 24 that have been created in the thin layer 22 of oxide align with the intersections of these trenches.

The deposition of the layer 22 of thin oxide uses conventional deposition technology and can, for instance, be deposited using PECVD procedures at a temperature of between about 350 and 450 degrees C. to a thickness between about 1000 and 4000 Angstrom using TEOS or $SiH_4$ as a source.

Standard photolithography and RIE procedures, using $CF_4/CHF_3$ as etchant gas, can be used to create the openings. 24 in the thin layer 22 of oxide.

Figure 6B:
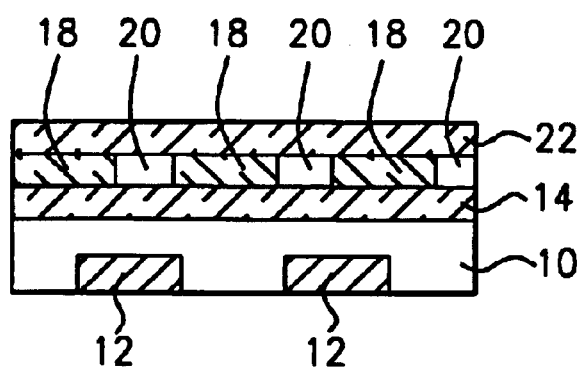
FIG. 6b shows a corresponding cross section taken in the X-direction.

FIG. 6b shows a cross section of surface 10, the metal contact points 12 in layer 10 and the layer 14 of dielectric that has been deposited over the surface 10. The cross section that is shown in FIG. 6b is a cross section in the X-direction of the surface 10 and shows the first layer of dielectric 14, the second layer 18 of dielectric that has been deposited over the first layer of dielectric 14 and the nitride 20 in the trenches that have been created in the second layer of dielectric 18. Also shown is a cross section of the deposited thin layer 22 of oxide.

After the openings 24 have been created in the thin layer 22 of oxide, the nitride that has been deposited in two layers of dielectric is now accessible for removal.

Figure 7A:
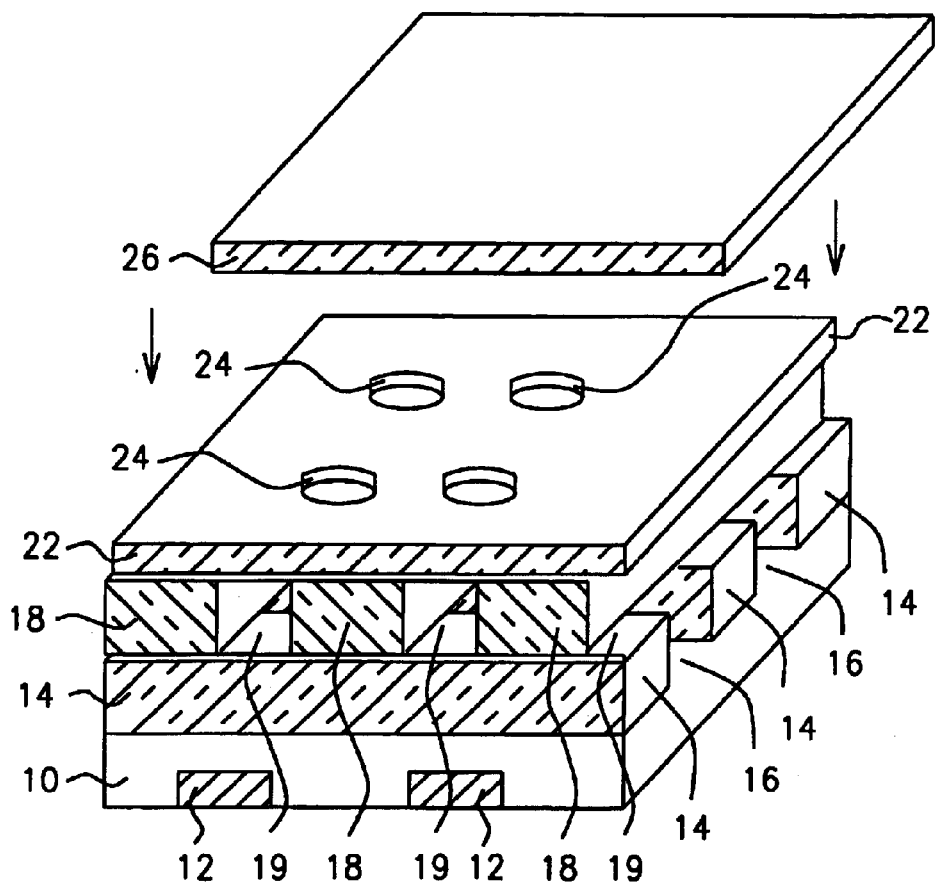
FIG. 7a shows an expanded view of a surface after the nitride has been removed from the trenches in the first and the second layer of dielectric and while a second thin layer of CVD oxide is being deposited to close off the openings in the first thin layer of oxide.

FIG. 7a shows an expanded view of the surface 10 after the nitride has been removed from the trenches in the first layer (14) and the second layer (18) of dielectric and while a second thin layer 26 of PECVD oxide is being deposited to close off, the openings 24 in the first thin layer 22 of oxide. This thin layer 26 of oxide is required to close the openings 24 thereby making the structure a self contained and complete structure and thereby furthermore enclosing the trenches that have been created in the first and the second layer of dielectric. Methods and techniques that can be used to deposit this layer 26 of oxide have previously been detailed and do therefore not need to be discussed any further at this point. The thickness of the thin oxide layer 26 is to be optimized such that adequate surface tension can be created such that the oxide of this layer 26 does not penetrate into openings 25 or into the trenches that have been created by the removal of the layers of nitride.

Figure 7B:
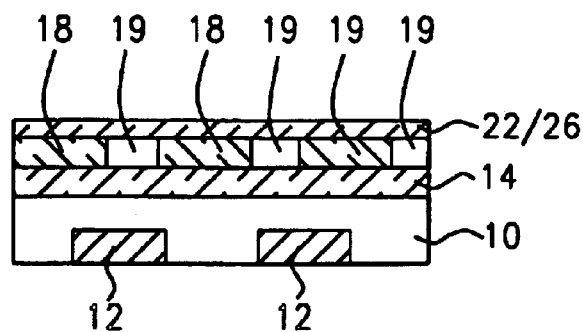
FIG. 7b shows a corresponding cross section taken in the X-direction.

FIG. 7b shows a cross section of surface 10, the metal contact points 12 in layer 10 and the layer 14 of dielectric that has been deposited over the surface 10. The cross section that is shown in FIG. 7b is a cross section in the X-direction of the surface 10 and shows the first layer of dielectric 14, the second layer 18 of dielectric that has been deposited over the first layer of dielectric 14 and the trenches 19 that have been created in the second layer of dielectric 18. Also shown is a cross section of the deposited thin layer 22 of oxide. Trenches 19 together with the trenches (not shown in FIG. 7b) that have been created in the first layer 14 of dielectric are interconnected and, after the removal of the nitride layers, filled with air thereby creating an excellent low-k layer of IMD. The nitride layers can be removed from the trenches created in the IMD by dipping the structure into hot phosphoric acid ($H_3PO_4$) (standard wet nitride removal).

Figure 8A:
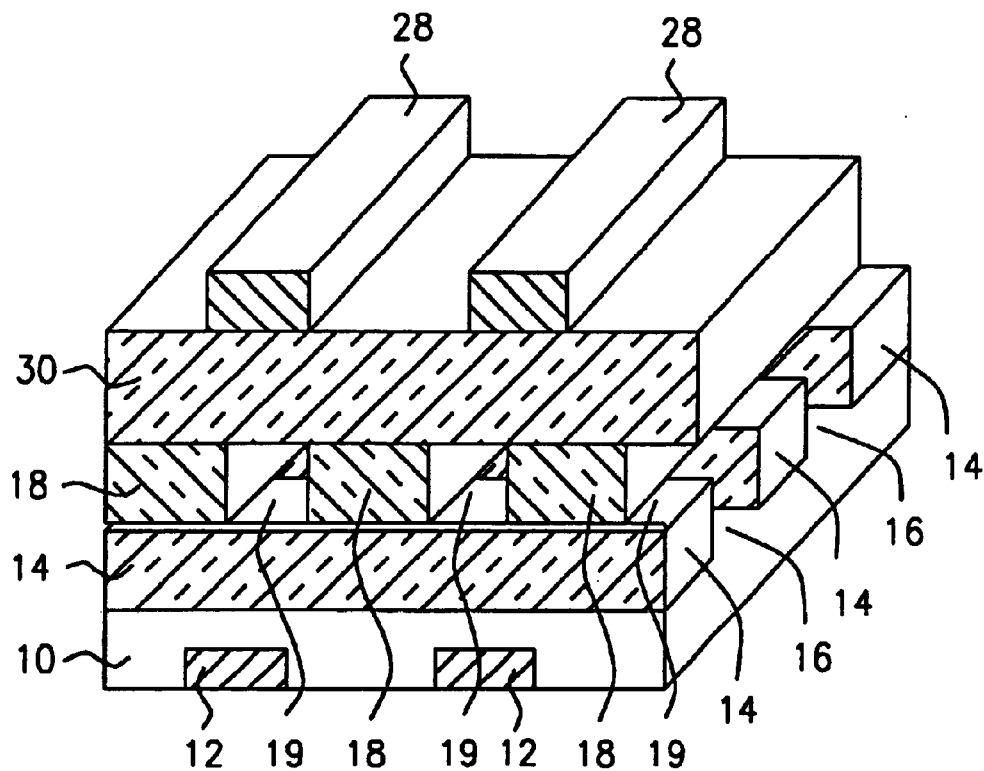
FIG. 8a shows an expanded view of a surface after metal lines have been deposited and patterned over the surface of the second thin layer of oxide.
Figure 8B:
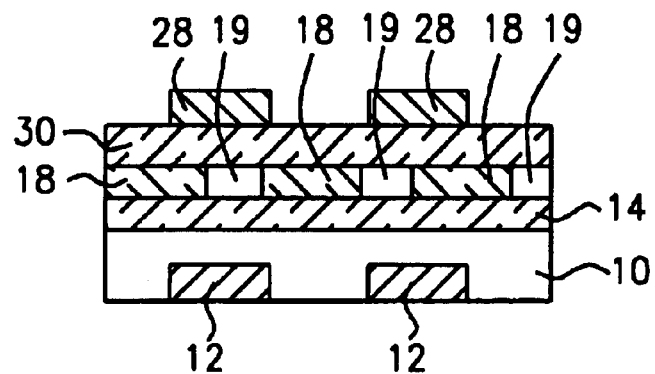
FIG. 8b shows a corresponding cross section taken in the X-direction.

FIG. 8a shows an expanded view of the surface 10 after metal lines have been deposited and patterned over the surface of the second thin layer 26 of oxide. Before the metal pattern 28 is deposited that layer of oxide that overlays the created IMD is grown to a thickness of between 3000 and 6000 Angstrom, this to complete the desired thickness of the layer of IMD. The thickness of the IMD is, among others, determined by the aspect ratio of the openings that may have to be created in this layer of IMD. The overall thickness of the layer of IMD, that is the combined thickness of layers 14, 18, 22, 26 and 30, may therefore have to be extended to between about 12,000 and 14,000 Angstrom.

Conventional methods can be used for the creation of the metal line pattern 28; a Ti/TiN/AlCu/TiN process is the preferred method to form this line pattern. Electrically conductive materials that can be used for the metal lines 28 include but are not limited to Al, Ti, Ta, W, Mo, Cu or a combination of these materials.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming air gaps between metal leads of a semiconductor device, comprising the steps of:

providing a semiconductor substrate whereby the surface of said semiconductor substrate has been provided with points of electrical contact;

forming a first network of nitride filled trenches in a first level of dielectric said first level of dielectric having been deposited on the surface of said substrate;

forming a second network of nitride filled trenches in a second level of dielectric said second level of dielectric having been deposited on the surface of said first level of dielectric whereby furthermore said second network of nitride filled trenches is in physical contact with and intersects with said first network of nitride filled trenches;

depositing a first thin layer of oxide over the surface of said second layer of dielectric;

etching openings in said first thin layer of oxide said openings to align with said intersects between said first network of nitride filled trenches and said second network of nitride filled trenches;

removing said nitride from said second network of trenches furthermore removing said nitride from said first network of trenches; and depositing a second thin layer of oxide over the surface of said first thin layer of oxide thereby closing said openings in said first thin layer of oxide.

2. The method of claim 1 wherein said forming a first network of nitride filled trenches in a first level of dielectric is:

depositing a first layer of dielectric over the surface of said substrate;

patterning and etching said first layer of dielectric thereby creating a first network of trenches in said first layer of dielectric;

depositing a first layer of nitride over the surface of said first layer of dielectric thereby including said first network of trenches; and polishing said first layer of nitride thereby essentially removing said first layer of nitride from the surface of said first layer of dielectric.

3. The method of claim 1 wherein said forming a second network of nitride filled trenches in a second level of dielectric is:

depositing a second layer of dielectric over the surface of said first layer of nitride thereby including said first layer of nitride;

patterning and etching said second layer of dielectric thereby creating a second network of trenches in said second layer of dielectric;

depositing a second layer of nitride over the surface of said first layer of dielectric thereby including said second network of trenches; and polishing said second layer of nitride thereby essentially removing said second layer of nitride from the surface of said second layer of dielectric.

4. The method of claim 1 wherein said first network of trenches intersects said second network of trenches under an angle of about 90 degrees, said angle being measured as an angle created between a first intersection and a second intersection, sand first intersection being an intersection of a first plane of a sidewall of a trench pertaining to said first network of trenches and the surface of said semiconductor substrate, said first plane having been extended towards said surface of said semiconductor substrate to enable intersection therewith, said second intersection being an intersect on of a second plane of a sidewall of a trench pertaining to said second network of trenches and the surface of said semiconductor substrate, said second plane having been extended towards said surface of said semiconductor substrate to enable intersection therewith.

5. The method of claim 1 wherein said first network of trenches intersects said second network of trenches under an angle other than 90 degrees, said angle being measured as an angle created between a first intersection and a second intersection, said first intersection being an intersection of a first plane of a sidewall of a trench pertaining to said first network of trenches and the surface of said semiconductor substrate, said first plane having been extended towards said surface of said semiconductor substrate to enable intersection therewith, said second intersection being an intersection of a second plane of a sidewall of a trench pertaining to said second network of trenches and the surface of said semiconductor substrate, said second plane having been extended towards said surface of said semiconductor substrate to enable intersection therewith.

6. The method of claim 1 with the additional step of further extending the thickness of the combined said first thin layer of oxide and said second layer of oxide thereby enabling the creation of openings of high aspect ratio in the extended layer of oxide combined with said first layer and said second layer of dielectric.

7. The method of claim 6 with the additional step of creating a network of metal interconnect lines on the surface of said extended layer of oxide.

8. The method of claim 1 with the additional step of forming a network of interconnect lines on the surface of said second thin layer of oxide.

9. The method of claim 1 with the additional steps of baking said first level of dielectric and/or said second level of dielectric said baking at a temperature between about 150 and 300 degrees C.

10. The method of claim 1 with the additional steps of curing said first level of dielectric and/or said second level of dielectric at an elevated temperature said curing at a temperature in excess of about 300 degrees C.

11. A method of forming air gaps between metal leads of a semiconductor device, comprising the steps of:

providing a semiconductor substrate whereby the surface of said semiconductor substrate has been provided with points of electrical contact;

forming a first network of trenches in a first level of dielectric said first level of dielectric having been deposited on the surface of said substrate whereby said first network of trenches is filled with a disposable solid layer, creating a first network of disposable solid filled trenches;

forming a second network of trenches in a second level of dielectric said second level of dielectric having been deposited on the surface of said first level of dielectric whereby said second network of trenches is in physical contact with and intersects with said first network of a disposable solid filled trenches whereby furthermore said second network of trenches is filled with a disposable solid layer, creating a second network of disposable solid filled trenches;

depositing a first thin layer of oxide over the surface of said second layer of dielectric;

etching openings in said first thin layer of oxide said openings to align with said intersects between said first network of trenches and said second network of trenches;

removing said disposable solid layer from said second network of trenches furthermore removing said disposable solid layer from said first network of trenches; and depositing a second thin layer of oxide over the surface of said first thin layer of oxide thereby closing said openings in said first thin layer of oxide.

12. The method of claim 11 wherein said disposable solid layer is a polymer and whereby said removing said disposable solid layer is exposing said substrate to $O_2$ oxygen plasma thereby evaporating said disposable solid layer.

13. The method of claim 11 wherein said removing said disposable solid layer is introducing a solvent to said substrate thereby dissolving said disposable solid layer.

14. The method of claim 11 wherein said removing said disposable solid layer is heating said substrate thereby evaporating said disposable solid layer.

15. The method of claim 11 wherein said first network of trenches intersects said second network of trenches under an angle of about 90 degrees, said angle being measured as an angle created between a first intersection and a second intersection, said first intersection being an intersection of a first plane of a sidewall of a trench pertaining to said first network of trenches and the surface of said semiconductor substrate, said first plane having been extended towards said surface of said semiconductor substrate to enable intersection therewith, said second intersection being an intersection of a second plane of a sidewall of a trench pertaining to said second network of trenches and the surface of said semiconductor substrate, said second plane having been extended towards said surface of said semiconductor substrate to enable intersection therewith.

16. The method of claim 11 wherein said first network of trenches intersects said second network of trenches under an angle other than 90 degrees, said angle being measured as an angle created between a first intersection and a second intersection, said first intersection being an intersection of a first plane of a sidewall of a trench pertaining to said first network of trenches and the surface of said semiconductor substrate, said first plane having been extended towards said surface of said semiconductor substrate to enable intersection therewith, said second intersection being an intersection of a second plane sidewall of a trench pertaining to said second network of trenches and the surface of said semiconductor substrate, said second plane having been extended towards said surface of said semiconductor substrate to enable intersection therewith.

17. The method of claim 11 with the additional step of further extending the thickness of the combined said first thin layer of oxide and said second layer of oxide thereby enabling the creation of openings of high aspect ratio in the extended layer of oxide combined with said first layer and said second layer of dielectric.

18. The method of claim 17, with the additional step of creating a network of metal interconnect lines on the surface of said extended layer of oxide.

19. The method of claim 11 with the additional step of forming a network of interconnect lines on the surface of said second than layer of oxide.

20. The method of claim 11 with the additional step of baking said first level of dielectric and/or said second level of dielectric said baking at a temperature between about 150 and 300 degrees C.

21. The method of claim 11 with the additional step of curing said first level of dielectric and/or said second level of dielectric at an elevated temperature said curing at a temperature in excess of about 300 degrees C.

22. A method of forming air gaps between metal leads of a semiconductor device, comprising the steps of:

providing a semiconductor substrate;

depositing a layer of metal on the surface of said substrate;

etching said metal layer in a pattern to form metal leads, said metal leads running in a Y-direction said metal leads furthermore having top surfaces;

depositing a first layer of dielectric over the surface of said substrate thereby including said metal leads;

creating trenches in said first level of dielectric said trenches running in a X-direction;

filling said trenches in said first layer of dielectric with a first layer of nitride or another disposable solid;

depositing a second layer of dielectric over the surface of said first layer of dielectric thereby including said first layer of nitride or another disposable solid;

creating trenches in said second level of dielectric said trenches running in a Y-direction said trenches furthermore having intersects with said trenches created in said first layer of dielectric;

filling said trenches in said second layer of dielectric with a second layer of nitride or another disposable solid;

depositing a first thin layer of oxide over the surface of said second layer of dielectric thereby including the surface of said second layer of nitride or other disposable solid;

etching openings in said first thin layer of oxide said openings to align with said intersects between said trenches created in said first level of dielectric and said trenches created in said second layer of dielectric;

removing said second layer of nitride or other disposable solid from said trenches created in said second layer of dielectric furthermore removing said first layer of nitride or other disposable solid from said trenches created in said first layer of dielectric thereby creating a network of trenches in said first layer of dielectric and in said second layer of dielectric whereby said trenches in said first layer of dielectric intersect said trenches in said second layer of dielectric under an angle of about 90 degrees, said angle of about 90 degrees being measured as an angle created between a first intersection and a second intersection, said first intersection being an intersection of a first plane of a sidewall of a trench pertaining to said trenches created in said first level of dielectric and the surface of said semiconductor substrate, said first plane having been extended towards said surface of said semiconductor substrate to enable intersection therewith, said second intersection being an intersection of a second plane of a sidewall of a trench pertaining to said trenches created in said second layer of dielectric and the surface of said semiconductor substrate, said second plane having been extended towards said surface of said semiconductor substrate to enable intersection therewith; and depositing a second thin layer of oxide over the surface of said first thin layer of oxide thereby closing off said openings in said first thin layer of oxide.

23. The method of claim 22 wherein said whereby said trenches in said first layer of dielectric intersect said trenches in said second layer of dielectric under an angle other than 90 degrees, said angle of about 90 degrees being measured as an angle created between a first intersection and a second intersection, said first intersection being an intersection of a first plane of a sidewall of a trench pertaining to said trenches created in said first level of dielectric and the surface of said semiconductor substrate, said first plane having been extended towards said surface of said semiconductor substrate to enable intersection therewith, said second intersection being an intersection of a second plane of a sidewall of a trench pertaining to said trenches created in said second layer of dielectric and the surface of said semiconductor substrate, said second plane having been extended towards said surface of said semiconductor substrate to enable intersection therewith.

* * * * *